(12) United States Patent
Lv et al.

(10) Patent No.: US 9,741,858 B2
(45) Date of Patent: Aug. 22, 2017

(54) AMORPHOUS SILICON SEMICONDUCTOR TFT BACKBOARD STRUCTURE

(71) Applicant: Shenzhen China Star Optoelectronics Technology Co., Ltd., Shenzhen (CN)

(72) Inventors: Xiaowen Lv, Shenzhen (CN); Chihyu Su, Shenzhen (CN); Yanhong Meng, Shenzhen (CN); Wenlin Mei, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 140 days.

(21) Appl. No.: 14/787,772

(22) PCT Filed: Oct. 13, 2015

(86) PCT No.: PCT/CN2015/091806
§ 371 (c)(1),
(2) Date: Oct. 29, 2015

(87) PCT Pub. No.: WO2017/045237
PCT Pub. Date: Mar. 23, 2017

(65) Prior Publication Data
US 2017/0162707 A1 Jun. 8, 2017

(30) Foreign Application Priority Data
Sep. 15, 2015 (CN) .......................... 2015 1 0586074

(51) Int. Cl.
*H01L 29/786* (2006.01)

(52) U.S. Cl.
CPC .. *H01L 29/78627* (2013.01); *H01L 29/78609* (2013.01); *H01L 29/78669* (2013.01)

(58) Field of Classification Search
None
See application file for complete search history.

(56) References Cited

U.S. PATENT DOCUMENTS 5,198,694 A * 3/1993 Kwasnick ......... H01L 21/32139
257/383
5,825,050 A * 10/1998 Hirakawa ......... H01L 29/66765
257/57

(Continued)

*Primary Examiner* — Michelle Mandala
(74) *Attorney, Agent, or Firm* — Leong C. Lei

(57) ABSTRACT

The present invention provides an amorphous silicon semiconductor TFT backboard structure, which includes a semiconductor layer (4) that has a multi-layer structure including a bottom amorphous silicon layer (41) in contact with a gate insulation layer (3), an N-type heavily-doped amorphous silicon layer (42) in contact with a source electrode (6) and a drain electrode (7), at least two N-type lightly-doped amorphous silicon layers (43) sandwiched between the bottom amorphous silicon layer (41) and the N-type heavily-doped amorphous silicon layer (42), a first intermediate amorphous silicon layer (44) separating every two adjacent ones of the lightly-doped amorphous silicon layers (43), and a second intermediate amorphous silicon layer (45) separating the N-type heavily-doped amorphous silicon layer (42) from the one of the lightly-doped amorphous silicon layers (43) that is closest to the N-type heavily-doped amorphous silicon layer (42). Such a structure further reduces the energy barrier between the drain electrode and the semiconductor layer, making injection of electron easier and ensuring the ON-state current is not lowered down and also helping increase the barrier for transmission of holes, lowering down the leakage current and improving reliability and electrical stability of the TFT.

12 Claims, 2 Drawing Sheets

(56) References Cited

U.S. PATENT DOCUMENTS

| | | | | |
|---|---|---|---|---|
| 7,968,885 B2 * | 6/2011 | Kobayashi | ............. | H01L 29/04 257/66 |
| 8,299,466 B2 * | 10/2012 | Furuta | ............... | H01L 29/66765 257/57 |

* cited by examiner

AMORPHOUS SILICON SEMICONDUCTOR TFT BACKBOARD STRUCTURE

BACKGROUND OF THE INVENTION

1. Field of the Invention

The present invention relates to the field of display technology, and in particular to an amorphous silicon semiconductor thin-film transistor (TFT) backboard structure.

2. The Related Arts

A flat panel display device has various advantages, such as thin device body, lower power consumption, and being free of radiation, and is thus widely used. The flat panel display devices that are currently available generally include liquid crystal displays (LCDs) and organic light emitting display (OLEDs).

A thin-film transistor (TFT) is an important component of a flat panel display device and can be formed on a glass substrate or a plastic substrate to generally serve as a switching device or a driving device for such as LCDs, OLEDs, or electrophoretic displays (EPDs).

According to the semiconductor material involved in a TFT, the TFTs can be classified as amorphous silicon (A-Si) semiconductor TFTs, poly-silicon (Poly-Si) semiconductor TFTs, and oxide semiconductor TFTs. Amorphous silicon is widely used in the semiconductor industry. The amorphous silicon semiconductor TFT has various advantages, such as simple manufacturing process, low cost, and being easily applicable to large-area manufacturing processes. Thus, the amorphous silicon semiconductor TFTs are most popularly used in the flat panel display devices.

Due to a relatively large potential difference existing in contact between an amorphous silicon material and a metal, it is hard for them to form an ohmic contact. In actual applications, to form an ohmic contact between a metal and an amorphous silicon semiconductor layer, it is commonplace to apply N-type heavy doping to a surface of the semiconductor layer that is in contact with the metal, namely doping a high concentration of phosphor (P) element in the surface of the semiconductor layer that is in contact with the metal in order to lower the contact resistance between the metal layer and the semiconductor layer.

FIG. 1 shows a conventional amorphous silicon semiconductor TFT backboard structure, which comprises a base plate 10, a gate electrode 20, a gate insulation layer 30, an amorphous silicon semiconductor layer 40, a source electrode 60, and a drain electrode 70. The amorphous silicon semiconductor layer 40 has a dual-layered structure, of which a bottom layer that is in contact with the gate insulation layer 30 is a pure amorphous silicon layer 41 without being subjected to any treatment and a top layer that is in contact with the source electrode 60 and the drain electrode 70 is an N-type heavily-doped amorphous silicon layer 42. The N-type heavily-doped amorphous layer 42 forms ohmic contact with the source electrode 60 and the drain electrode 70 so as to reduce the contact resistance between the source and drain electrodes 60, 70 and the semiconductor layer 40, thereby heightening current efficiency and increasing ON-state current ($I_{on}$).

However, the amorphous silicon semiconductor TFT backboard structure shown in FIG. 1 suffers certain problems while increasing the ON-state current. As indicated by a TFT current curve illustrated with phantom lines in FIG. 3, when a gate voltage (Vg) of a TFT is a negative voltage and the negative voltage is increased to a predetermined level, more positive charges will be excited and generated to form a hole conduction channel, leading to a relatively large hole current ($I_{off}$), so as to reduce the reliability of the TFT and making electrical stability of the TFT deteriorating.

SUMMARY OF THE INVENTION

An object of the present invention is to provide an amorphous silicon semiconductor thin-film transistor (TFT) backboard structure, which helps reduce leakage current and increases reliability and electrical stability of the TFT without lowering down an ON-state current.

To achieve the above objects, the present invention provides an amorphous silicon semiconductor TFT backboard structure, which comprises: a base plate, a gate electrode formed on the base plate, a gate insulation layer set on and covering the gate electrode and the base plate, a semiconductor layer formed on the gate insulation layer and located above the gate electrode, and a source electrode and a drain electrode formed on the gate insulation layer and each in contact with an upper surface of the semiconductor layer, wherein the semiconductor layer comprises a multi-layer structure, which comprises a bottom amorphous silicon layer in contact with the gate insulation layer, an N-type heavily-doped amorphous silicon layer in contact with the source electrode and the drain electrode, at least two N-type lightly-doped amorphous silicon layers sandwiched between the bottom amorphous silicon layer and the N-type heavily-doped amorphous silicon layer, a first intermediate amorphous silicon layer separating every two adjacent ones of the lightly-doped amorphous silicon layers, and a second intermediate amorphous silicon layer separating the N-type heavily-doped amorphous silicon layer from the one of the lightly-doped amorphous silicon layers that is closest to the N-type heavily-doped amorphous silicon layer; and a channel section formed in the middle of the semiconductor layer and extending through the N-type heavily-doped amorphous silicon layer, the second intermediate amorphous silicon layer, the first intermediate amorphous silicon layer, and all the N-type lightly-doped amorphous silicon layers.

The number of the N-type lightly-doped amorphous silicon layers is two.

The lightly-doped amorphous silicon layer that is close to the N-type heavily-doped amorphous silicon layer has an ion doping concentration that is greater than an ion doping concentration of the lightly-doped amorphous silicon layer that is close to the bottom amorphous silicon layer.

The N-type lightly-doped amorphous silicon layers and the N-type heavily-doped amorphous silicon layer have thicknesses that are substantially identical.

The semiconductor layer is formed by chemical vapor deposition and etching operations.

The base plate comprises a glass plate.

The gate electrode, the source electrode, and the drain electrode are formed of materials that comprise one of molybdenum, titanium, aluminum, and copper or a stack of multiple ones thereof.

The gate insulation layer is formed of a material comprising silicon nitride, silicon oxide, or a combination thereof.

The present invention also provides an amorphous silicon semiconductor TFT backboard structure, which comprises: a base plate, a gate electrode formed on the base plate, a gate insulation layer set on and covering the gate electrode and the base plate, a semiconductor layer formed on the gate insulation layer and located above the gate electrode, and a source electrode and a drain electrode formed on the gate insulation layer and each in contact with an upper surface of the semiconductor layer, wherein the semiconductor layer comprises a multi-layer structure, which comprises a bottom amorphous silicon layer in contact with the gate insulation layer, an N-type heavily-doped amorphous silicon layer in contact with the source electrode and the drain electrode, at least two N-type lightly-doped amorphous silicon layers sandwiched between the bottom amorphous silicon layer and the N-type heavily-doped amorphous silicon layer, a first intermediate amorphous silicon layer separating every two adjacent ones of the lightly-doped amorphous silicon layers, and a second intermediate amorphous silicon layer separating the N-type heavily-doped amorphous silicon layer from the one of the lightly-doped amorphous silicon layers that is closest to the N-type heavily-doped amorphous silicon layer; and a channel section formed in the middle of the semiconductor layer and extending through the N-type heavily-doped amorphous silicon layer, the second intermediate amorphous silicon layer, the first intermediate amorphous silicon layer, and all the N-type lightly-doped amorphous silicon layers;

wherein the number of the N-type lightly-doped amorphous silicon layers is two;

wherein the base plate comprises a glass plate;

wherein the gate electrode, the source electrode, and the drain electrode are formed of materials that comprise one of molybdenum, titanium, aluminum, and copper or a stack of multiple ones thereof; and wherein the gate insulation layer is formed of a material comprising silicon nitride, silicon oxide, or a combination thereof.

The efficacy of the present invention is that the present invention provides an amorphous silicon semiconductor TFT backboard structure, which comprises a semiconductor layer that is arranged as a multi-layer structure that comprises at least two N-type lightly-doped amorphous silicon layers sandwiched between the bottom amorphous silicon layer and the N-type heavily-doped amorphous silicon layer with every two adjacent lightly-doped amorphous silicon layer being separated by a first intermediate amorphous silicon layer and the N-type heavily-doped amorphous silicon layer and the lightly-doped amorphous silicon layer that is closest to the N-type heavily-doped amorphous silicon layer being separated by a second intermediate amorphous silicon layer. Such a structure further reduces the energy barrier between the source and drain electrodes and the semiconductor layer, making injection of electron easier and ensuring the ON-state current is not lowered down and also helping increase the barrier for transmission of holes, sharing more voltage between the gate electrode and the source electrode of the TFT, thereby lowering down the leakage current and improving reliability and electrical stability of the TFT.

For better understanding of the features and technical contents of the present invention, reference will be made to the following detailed description of the present invention and the attached drawings. However, the drawings are provided for the purposes of reference and illustration and are not intended to impose limitations to the present invention.

BRIEF DESCRIPTION OF THE DRAWINGS

The technical solution, as well as other beneficial advantages, of the present invention will become apparent from the following detailed description of an embodiment of the present invention, with reference to the attached drawings.

In the drawings.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
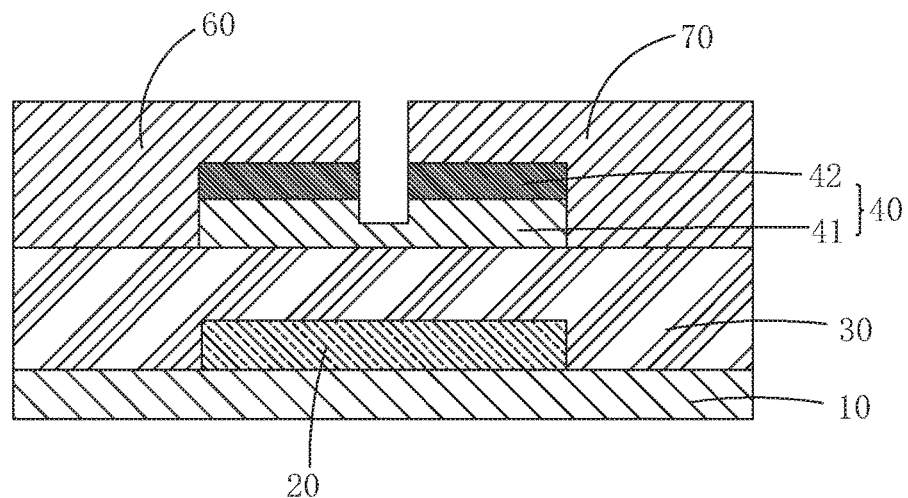
FIG. 1 is a cross-sectional view showing a conventional amorphous silicon semiconductor thin-film transistor (TFT) backboard structure.
Figure 2:
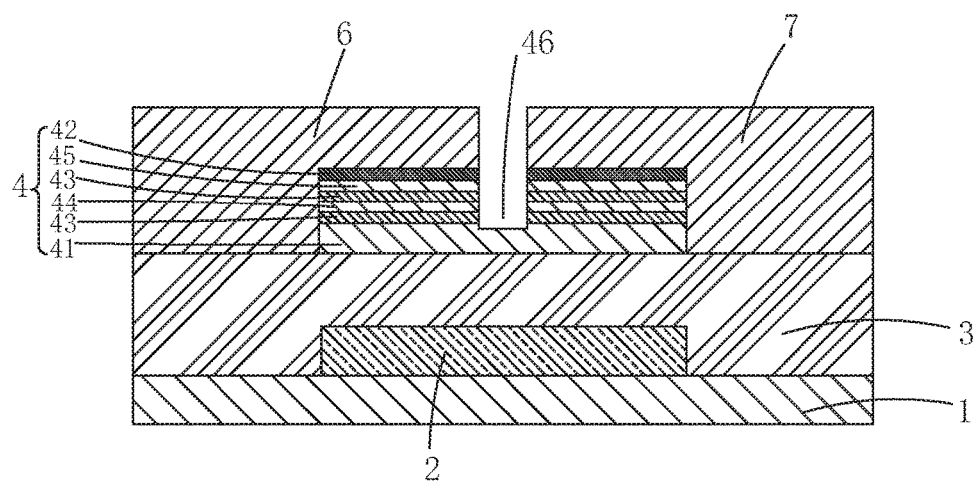
FIG. 2 is a cross-sectional view showing an amorphous silicon semiconductor TFT backboard structure according to the present invention.

Referring to FIG. 2, the present invention provides an amorphous silicon semiconductor thin-film transistor (TFT) backboard structure, which comprises: a base plate 1, a gate electrode 2 formed on the base plate 1, a gate insulation layer 3 set on and covering the gate electrode 2 and the base plate 1, a semiconductor layer 4 formed on the gate insulation layer 3 and located above the gate electrode 2, and a source electrode 6 and a drain electrode 7 formed on the gate insulation layer 3 and each in contact with an upper surface of the semiconductor layer 4.

It should be noted here that the semiconductor layer 4 comprises a multi-layer structure, which comprises a bottom amorphous silicon layer 41 in contact with the gate insulation layer 3, an N-type heavily-doped amorphous silicon layer 42 in contact with the source electrode 6 and the drain electrode 7, at least two N-type lightly-doped amorphous silicon layers 43 sandwiched between the bottom amorphous silicon layer 41 and the N-type heavily-doped amorphous silicon layer 42, a first intermediate amorphous silicon layer 44 separating every two adjacent ones of the lightly-doped amorphous silicon layers 43, and a second intermediate amorphous silicon layer 45 separating the N-type heavily-doped amorphous silicon layer 42 from the one of the lightly-doped amorphous silicon layers 43 that is closest to the N-type heavily-doped amorphous silicon layer 42; and a channel section 46 formed in the middle of the semiconductor layer 4 and extending completely through the N-type heavily-doped amorphous silicon layer 42, the second intermediate amorphous silicon layer 45, the first intermediate amorphous silicon layer 44, and all the N-type lightly-doped amorphous silicon layers 43.

Preferably, as shown in FIG. 2, the number of the N-type lightly-doped amorphous silicon layers 43 used in two and the two N-type lightly-doped amorphous silicon layers 43 are separated from each other by the first intermediate amorphous silicon layer 44. The lightly-doped amorphous silicon layer 43 that is close to the N-type heavily-doped amorphous silicon layer 42 has a phosphorous ion doping concentration that is greater than a phosphorous ion doping concentration of the lightly-doped amorphous silicon layer 43 that is close to the bottom amorphous silicon layer 41. It is apparent that the number of the N-type lightly-doped amorphous silicon layers 43 involved may be three, four, or even more and every two adjacent lightly-doped amorphous silicon layers 43 comprise one first intermediate amorphous silicon layer 44 interposed therebetween for separation. The multiple N-type lightly-doped amorphous silicon layers 43 are arranged to have phosphorous ion doping concentrations that are increased in sequence from bottom to top.

Specifically, the N-type lightly-doped amorphous silicon layers 43 and the N-type heavily-doped amorphous silicon layer 42 have thicknesses that are identical.

Taking the amorphous silicon semiconductor TFT backboard structure of FIG. 2 as an example, the semiconductor layer 4 is first subjected to chemical vapor deposition (CVD) to sequentially deposit the bottom amorphous silicon layer 41, the N-type lightly-doped amorphous silicon layer 43, the first intermediate amorphous silicon layer 44, the N-type lightly-doped amorphous silicon layer 43, the second intermediate amorphous silicon layer 45, and the N-type heavily-doped amorphous silicon layer 42. Deposition of the bottom amorphous silicon layer 41, the first intermediate amorphous silicon layer 44, the second intermediate amorphous silicon layer 45 is conducted with pure amorphous silicon, while deposition of the two N-type lightly-doped amorphous silicon layers 43 and the N-type heavily-doped amorphous silicon layer 42 is conducted in such a way that while amorphous silicon is deposited, a gas containing phosphorous ions is introduced, wherein through regulation of the concentration and flow of the gas containing phosphorous ions, different phosphorous ion doping concentrations cab be controlled and achieved. After the deposition, etching is applied to form the channel section 46.

Further, the base plate 1 can be a glass plate; the gate electrode 2, the source electrode 6, and the drain electrode 7 are formed of materials that comprise one of molybdenum (Mo), titanium (Ti), aluminum (Al), copper (Cu) or a stack of multiple ones thereof; the gate insulation layer 3 is formed of a material comprising silicon nitride (SiNx), silicon oxide (SiOx), or a combination thereof.

Figure 3:
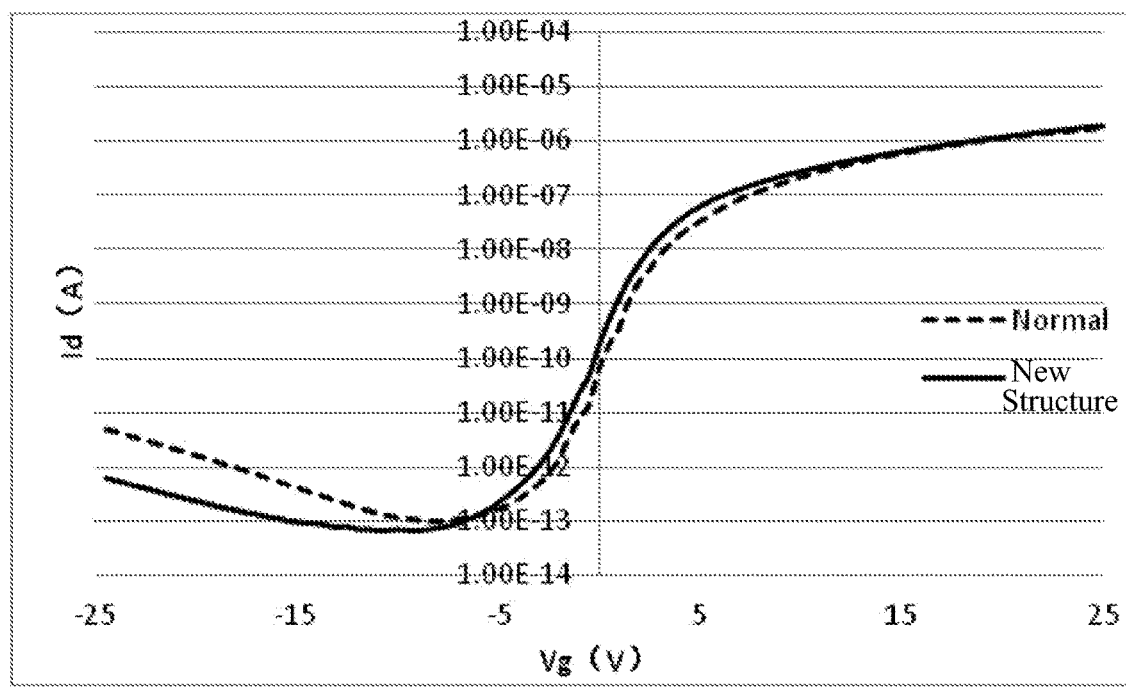
FIG. 3 shows TFT current curves of the amorphous silicon semiconductor TFT backboard and the conventional amorphous silicon semiconductor TFT backboard of FIG. 1 for comparison.

Referring to FIG. 3, a TFT current curve of the amorphous silicon semiconductor TFT backboard structure according to the present invention, which is indicated by a solid line, when compared with a TFT current curve of a conventional amorphous silicon semiconductor TFT backboard structure that is indicated by a phantom line, shows that the TFT ON-state current of the amorphous silicon semiconductor TFT backboard structure of the present invention is increased and when the gate voltage Vg of the TFT is negative and is increased to a predetermined level, the leakage current is reduced, this being because the semiconductor layer 4 is a multi-layer structure that comprises at least two N-type lightly-doped amorphous silicon layers 43 sandwiched between the bottom amorphous silicon layer 41 and the N-type heavily-doped amorphous silicon layer 42 with every two adjacent lightly-doped amorphous silicon layer 43 being separated by a first intermediate amorphous silicon layer 44 and the N-type heavily-doped amorphous silicon layer 42 and the lightly-doped amorphous silicon layer 43 that is closest to the N-type heavily-doped amorphous silicon layer 42 being separated by a second intermediate amorphous silicon layer 45. Such a structure further reduces the energy barrier between the source and drain electrodes 6, 7 and the semiconductor layer 4, making injection of electron easier and ensuring the ON-state current is not lowered down and also helping increase the barrier for transmission of holes, sharing more voltage between the gate electrode and the source electrode of the TFT, thereby lowering down the leakage current and improving reliability and electrical stability of the TFT.

In summary, the present invention provides an amorphous silicon semiconductor TFT backboard structure, which comprises a semiconductor layer that is arranged as a multi-layer structure that comprises at least two N-type lightly-doped amorphous silicon layers sandwiched between the bottom amorphous silicon layer and the N-type heavily-doped amorphous silicon layer with every two adjacent lightly-doped amorphous silicon layer being separated by a first intermediate amorphous silicon layer and the N-type heavily-doped amorphous silicon layer and the lightly-doped amorphous silicon layer that is closest to the N-type heavily-doped amorphous silicon layer being separated by a second intermediate amorphous silicon layer. Such a structure further reduces the energy barrier between the source and drain electrodes and the semiconductor layer, making injection of electron easier and ensuring the ON-state current is not lowered down and also helping increase the barrier for transmission of holes, sharing more voltage between the gate electrode and the source electrode of the TFT, thereby lowering down the leakage current and improving reliability and electrical stability of the TFT.

Based on the description given above, those having ordinary skills of the art may easily contemplate various changes and modifications of the technical solution and technical ideas of the present invention and all these changes and modifications are considered within the protection scope of right for the present invention.

What is claimed is:

1. An amorphous silicon semiconductor thin-film transistor (TFT) backboard structure, comprising: a base plate, a gate electrode formed on the base plate, a gate insulation layer set on and covering the gate electrode and the base plate, a semiconductor layer formed on the gate insulation layer and located above the gate electrode, and a source electrode and a drain electrode formed on the gate insulation layer and each in contact with an upper surface of the semiconductor layer, wherein the semiconductor layer comprises a multi-layer structure, which comprises a bottom amorphous silicon layer in contact with the gate insulation layer, an N-type heavily-doped amorphous silicon layer in contact with the source electrode and the drain electrode, at least two N-type lightly-doped amorphous silicon layers sandwiched between the bottom amorphous silicon layer and the N-type heavily-doped amorphous silicon layer, a first intermediate amorphous silicon layer separating every two adjacent ones of the lightly-doped amorphous silicon layers, and a second intermediate amorphous silicon layer separating the N-type heavily-doped amorphous silicon layer from the one of the lightly-doped amorphous silicon layers that is closest to the N-type heavily-doped amorphous silicon layer; and a channel section formed in the middle of the semiconductor layer and extending through the N-type heavily-doped amorphous silicon layer, the second intermediate amorphous silicon layer, the first intermediate amorphous silicon layer, and all the N-type lightly-doped amorphous silicon layers.

2. The amorphous silicon semiconductor TFT backboard structure as claimed in claim 1, wherein the number of the N-type lightly-doped amorphous silicon layers is two.

3. The amorphous silicon semiconductor TFT backboard structure as claimed in claim 2, wherein the lightly-doped amorphous silicon layer that is close to the N-type heavily-doped amorphous silicon layer has an ion doping concentration that is greater than an ion doping concentration of the lightly-doped amorphous silicon layer that is close to the bottom amorphous silicon layer.

4. The amorphous silicon semiconductor TFT backboard structure as claimed in claim 2, wherein the N-type lightly-doped amorphous silicon layers and the N-type heavily-doped amorphous silicon layer have thicknesses that are identical.

5. The amorphous silicon semiconductor TFT backboard structure as claimed in claim 3, wherein the semiconductor layer is formed by chemical vapor deposition and etching operations.

6. The amorphous silicon semiconductor TFT backboard structure as claimed in claim 1, wherein the base plate comprises a glass plate.

7. The amorphous silicon semiconductor TFT backboard structure as claimed in claim 1, wherein the gate electrode, the source electrode, and the drain electrode are formed of materials that comprise one of molybdenum, titanium, aluminum, and copper or a stack of multiple ones thereof.

8. The amorphous silicon semiconductor TFT backboard structure as claimed in claim 1, wherein the gate insulation layer is formed of a material comprising silicon nitride, silicon oxide, or a combination thereof.

9. An amorphous silicon semiconductor thin-film transistor (TFT) backboard structure, comprising: a base plate, a gate electrode formed on the base plate, a gate insulation layer set on and covering the gate electrode and the base plate, a semiconductor layer formed on the gate insulation layer and located above the gate electrode, and a source electrode and a drain electrode formed on the gate insulation layer and each in contact with an upper surface of the semiconductor layer,
wherein the semiconductor layer comprises a multi-layer structure, which comprises a bottom amorphous silicon layer in contact with the gate insulation layer, an N-type heavily-doped amorphous silicon layer in contact with the source electrode and the drain electrode, at least two N-type lightly-doped amorphous silicon layers sandwiched between the bottom amorphous silicon layer and the N-type heavily-doped amorphous silicon layer, a first intermediate amorphous silicon layer separating every two adjacent ones of the lightly-doped amorphous silicon layers, and a second intermediate amorphous silicon layer separating the N-type heavily-doped amorphous silicon layer from the one of the lightly-doped amorphous silicon layers that is closest to the N-type heavily-doped amorphous silicon layer; and a channel section formed in the middle of the semiconductor layer and extending through the N-type heavily-doped amorphous silicon layer, the second intermediate amorphous silicon layer, the first intermediate amorphous silicon layer, and all the N-type lightly-doped amorphous silicon layers;
wherein the number of the N-type lightly-doped amorphous silicon layers is two;
wherein the base plate comprises a glass plate;
wherein the gate electrode, the source electrode, and the drain electrode are formed of materials that comprise one of molybdenum, titanium, aluminum, and copper or a stack of multiple ones thereof; and
wherein the gate insulation layer is formed of a material comprising silicon nitride, silicon oxide, or a combination thereof.

10. The amorphous silicon semiconductor TFT backboard structure as claimed in claim 9, wherein the lightly-doped amorphous silicon layer that is close to the N-type heavily-doped amorphous silicon layer has an ion doping concentration that is greater than an ion doping concentration of the lightly-doped amorphous silicon layer that is close to the bottom amorphous silicon layer.

11. The amorphous silicon semiconductor TFT backboard structure as claimed in claim 9, wherein the N-type lightly-doped amorphous silicon layers and the N-type heavily-doped amorphous silicon layer have thicknesses that are identical.

12. The amorphous silicon semiconductor TFT backboard structure as claimed in claim 10, wherein the semiconductor layer is formed by chemical vapor deposition and etching operations.

\* \* \* \* \*